United States Patent
Kawahara et al.

(10) Patent No.: US 7,264,359 B2
(45) Date of Patent: Sep. 4, 2007

(54) COOLING APPARATUS

(75) Inventors: Shoji Kawahara, Okayama (JP); Shuu Nanba, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 148 days.

(21) Appl. No.: 10/547,012

(22) PCT Filed: May 28, 2004

(86) PCT No.: PCT/JP2004/007793

§ 371 (c)(1),
(2), (4) Date: Aug. 25, 2005

(87) PCT Pub. No.: WO2004/107837

PCT Pub. Date: Dec. 9, 2004

(65) Prior Publication Data

US 2006/0157230 A1 Jul. 20, 2006

(30) Foreign Application Priority Data

May 30, 2003 (JP) ............................ 2003-155045

(51) Int. Cl.
*G03B 21/16* (2006.01)
*G03B 21/18* (2006.01)
*G02F 1/1333* (2006.01)
*H04N 5/74* (2006.01)
*F28F 7/00* (2006.01)
*F28D 15/00* (2006.01)
*H02K 7/20* (2006.01)

(52) U.S. Cl. .......................... 353/54; 353/56; 353/57; 349/161; 348/748; 165/80.4; 165/104.33; 361/689; 361/699

(58) Field of Classification Search .................. 353/54, 353/52, 56, 57, 58, 60, 61; 349/161; 348/748; 361/676, 688, 689, 697–699, 703, 711, 831; 165/80.2, 80.3, 80.4, 80.5, 104.33
See application file for complete search history.

(56) References Cited

U.S. PATENT DOCUMENTS 6,322,218 B1 * 11/2001 Sugawara et al. ............ 353/52
2002/0135741 A1 * 9/2002 Lee et al. ..................... 353/61

FOREIGN PATENT DOCUMENTS

| JP | 2001-110955 A | 4/2001 |
| JP | 2001-183042 A | 7/2001 |
| JP | 2001-320187 A | 11/2001 |
| JP | 2002-094276 A | 3/2002 |
| JP | 2004-134423 A | 4/2004 |

OTHER PUBLICATIONS

Translation of 2001-320187, Pub. Date—Nov. 16, 2001.*
International Search Report for PCT/JP2004/007793, dated Sep. 7, 2004, with an English translation thereof.

* cited by examiner

*Primary Examiner*—Rochelle Blackman
(74) *Attorney, Agent, or Firm*—RatnerPrestia (57) ABSTRACT

A cooling apparatus includes a heat receiving casing thermally joined to a heating object directly or indirectly, a first device having hoses which communicate inside of the heat receiving casing, a fluid medium inside the heat receiving casing and in the hoses. The cooling apparatus also includes a solution sending pump circulating the fluid medium provided inside the heat receiving casing, and a second device having a radiator for cooling the circulated fluid medium, and a radiating fan.

10 Claims, 11 Drawing Sheets

COOLING APPARATUS

This application is a U.S. national phase application of PCT international application PCT/JP2004/007793.

TECHNICAL FIELD

The present invention relates to a cooling apparatus for circulating a fluid medium and thereby cooling or controlling temperature of heated electronic parts, such as a semiconductor and a CPU mounted in a cabinet usable for electronic devices including, for instance, a projection display apparatus for projecting an image by enlarging it on a screen with a projection lens, a personal computer and a semiconductor laser apparatus.

BACKGROUND ART

A portable electronic device represented by a notebook-sized personal computer or a mobile communication device is equipped with a microprocessor of processing multimedia information.

This kind of microprocessor tends to rapidly increase a heating value during operation in conjunction with increasing computing speed and multifunctionality.

For that reason, it is necessary, for the sake of stably assuring the operation of the microprocessor, to improve its cooling capability to meet that heating value.

As for an electronic device represented by a semiconductor laser source apparatus, it is necessary to exert temperature control over a semiconductor which is an oscillation source to an adequate temperature from a perspective of implementing higher power and securing wavelength stability of a beam.

Because of demands for miniaturization in recent years, a temperature controller thereof is required to be miniaturized and have high temperature control performance.

As for a display apparatus represented by a projection display apparatus of irradiating an image modulated into video signals on a light valve with illumination light and projecting the image by enlarging it on a screen with a projection lens, a display device comprised of a high-resolution light valve is used therein in order to project image information more clearly, and higher luminance for a brighter projection screen is further promoted.

The display device of the projection display apparatus required to be high-luminance absorbs heat of the light of components not effectively projected on the screen against incident light in principle. Therefore, heating of the display device limits an increase in the luminance.

As a countermeasure against it, a reflective display device of a liquid crystal and so on is increasingly used instead of a transmissive liquid crystal display device.

Even in the case of the reflective display device, a slight light absorption occurs. Therefore, it is necessary to forcibly cool the reflective display device.

For this reason, use is increasingly made of a cooling apparatus having integrated an adjustment mechanism of accurately positioning the reflective display device, a cooling element of forcibly cooling the reflective display device, a heat sink of cooling a radiating side of the cooling element and a cooling fan of air-cooling the heat sink.

Hereunder, a concrete description will be given as to a conventional technique relating to heat countermeasures of the electronic device and display apparatus.

Here, the description will be given by taking an example of a cooling apparatus of the projection display apparatus using a general reflective display device.

An optical system of the projection display apparatus is basically comprised of a light source lamp unit, a display device comprised of a reflective liquid crystal panel of color-separating white light from the light source of the light source lamp unit into red (R) green (G) and blue (B) and modulating these rays according to the image information, an optical unit of color-composing the modulated light, and a projection lens unit of projecting the color-composed light by enlarging it on the screen.

Recently, a high-resolution display device is increasingly used for the projection display apparatus in order to project image information more clearly, and higher luminance for the brighter projection screen is further promoted as described above.

A description will be given by using FIGS. 10 and 11 as to an example of a conventional 3-light value projection display apparatus using reflective display devices of R, G and B and a cooling apparatus thereof.

Figure 10:
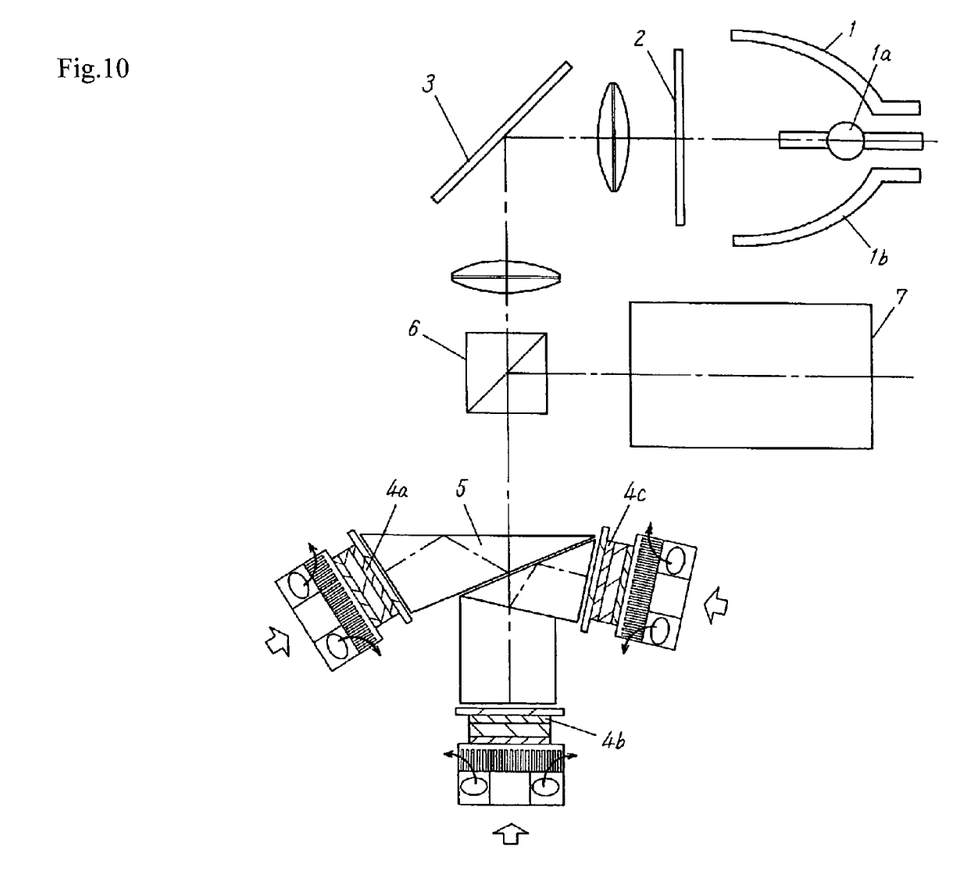
FIG. 10 is a schematic block diagram of a conventional projection display apparatus.

First, FIG. 10 is a diagram showing a schematic configuration of a conventional projection display apparatus.

The conventional projection display apparatus is comprised of a light source lamp unit 1 which is a light source of projecting the image information by optically enlarging it, a filter 2 of eliminating infrared rays and ultraviolet rays from the light of the light source lamp unit 1 and transmitting only visible light, an irradiation optical unit 3 of focusing the visible light from the filter 2, a color separation and composition prism unit 5 of color-separating the light focused by the irradiation optical unit 3 after passing a reflecting prism unit 6 to lead it to reflective display devices 4a, 4b and 4c and also color-composing the light optically generated as the image information by the reflective display devices 4a, 4b and 4c, and a projection lens unit 7 of enlarging and projecting the image information composed by the color separation and composition prism unit 5 which is reflected by the reflecting prism unit 6.

The light source lamp unit 1 is comprised of a superhigh pressure mercury lamp 1a generally having high luminous efficiency and a concave mirror 1b of efficiently focusing the light.

The color separation and composition prism unit 5 of color-separating and color-composing the light from the light source lamp unit 1 into R, G and B is comprised of a blue-reflecting dichroic mirror, a red-reflecting dichroic mirror and a green-transmitting dichroic mirror of selecting the white light wavelength-wise for instance.

The white light is color-separated into R, G and B from their respective coating characteristics to be led to the reflective display devices 4a, 4b and 4c of R, G and B respectively. And the light modulated into the image information by the reflective display devices 4a, 4b and 4c is composed again by the color separation and composition prism unit 5.

The reflecting prism unit 6 is an integral prism of a so-called half-mirror configuration of transmitting the light from the irradiation optical unit 3 and leading the light color-composed by the color separation and composition prism unit 5 to the projection lens unit 7.

Figure 11:
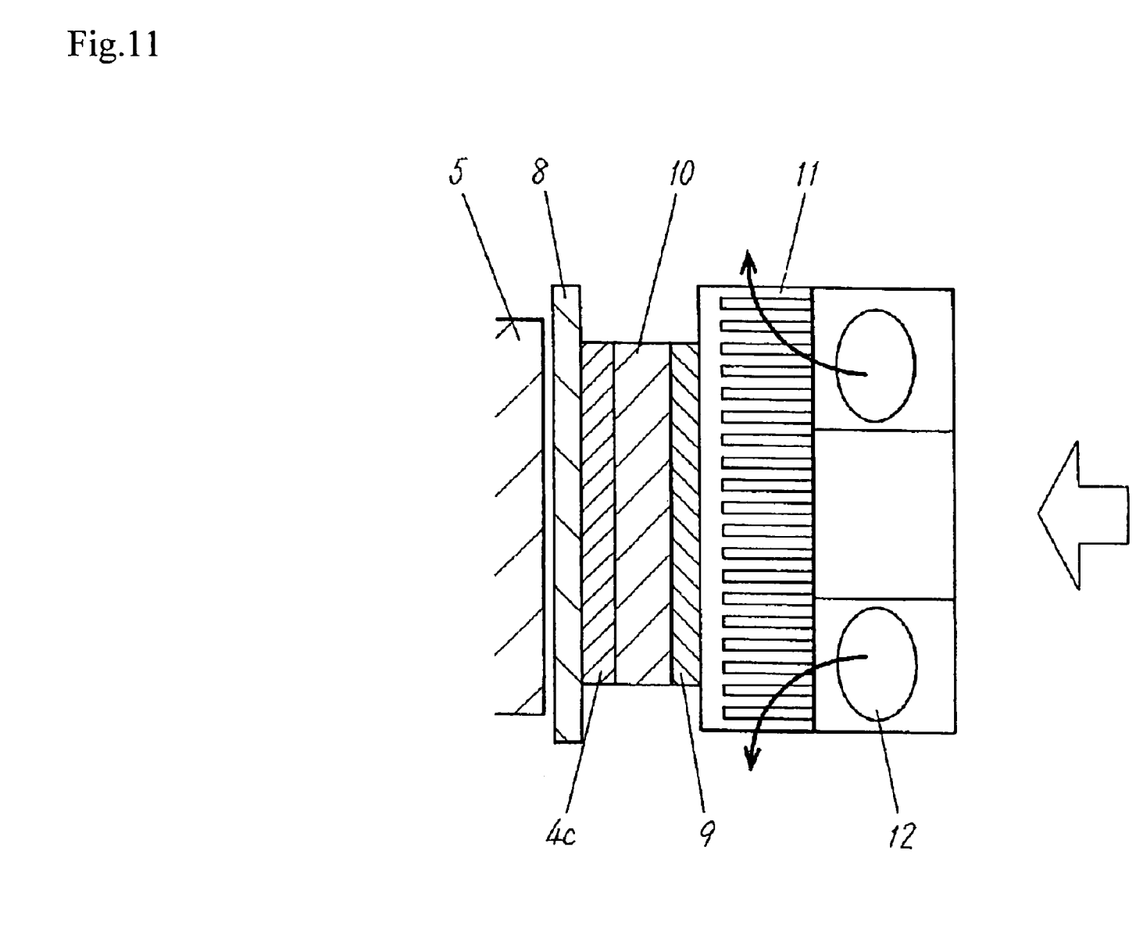
FIG. 11 is a schematic sectional view of a conventional cooling apparatus.

FIG. 11 is a schematic sectional view showing the cooling apparatus of the conventional reflective display device.

FIG. 11 shows only the reflective display device 4c. And, the reflective display device 4a and 4b also have the same configuration.

The reflective display device 4c has its one surface joined and fixed by an adhesive to a position adjustment mechanism 8 capable of planar position adjustment and focus adjustment. The position adjustment mechanism 8 is accurately positioned and fixed by joining or by an adhesive to the color separation and composition prism unit 5.

The other surface of reflective display device 4c is joined to a thermoelectric cooling element 9 comprised of a semiconductor via a holder 10 also playing a role of thermal conduction.

The thermoelectric cooling element 9 has a heat sink 11 for its radiation joined thereto, and the heat sink 11 has a cooling fan 12 of cooling it joined thereto.

The cooling fan 12, heat sink 11 and holder 10 are integrally assembled with screws and so on (not shown).

As for the conventional cooling apparatus as described above, however, a larger volume of light is focused on the reflective display devices 4a, 4b and 4c in the case of the projection display apparatus targeting higher luminance. Therefore, it is necessary to improve the cooling capability.

For that reason, the thermoelectric cooling element 9, heat sink 11 and cooling fan 12 having higher capability become necessary, which leads not only to growth in size of the apparatus but also to an increase in weight thereof.

As the cooling apparatus needs to radiate a total heating value of the heating value of power consumption meeting an endothermic amount of the thermoelectric cooling element 9 and the heating value of the reflective display devices, the cooling fan 12 becomes larger than expected.

As the cooling fan 12 is joined to the heat sink 11, draft resistance may become excessive leading to louder blast noise.

In the case where the endothermic amount of the thermoelectric cooling element 9 is increased, the holder 10 of functioning as a thermal conduction member may have dew condensation generated thereon because a junction side of the thermoelectric cooling element 9 reaches temperature significantly lower than ambient temperature.

Because of the structure of the cooling fan 12, a central portion thereof is a motor drive portion of the cooling fan 12 so that only outer portions of the heat sink 11 are cooled by draft as indicated by arrows in FIG. 11 and cooling efficiency of the heat sink 11 is apt to be deteriorated.

In view of radiation routes, there are three material junctions between the reflective display device 4c and the holder 10, between the holder 10 and the thermoelectric cooling element 9, and between the thermoelectric cooling element 9 and the heat sink 11.

For this reason, an impedance of heat transfer, that is, a thermal resistance becomes so high that very high radiation capability must ordinarily be designed.

Furthermore, driving power of the light source lamp unit is becoming higher in conjunction with the higher luminance of the projection display apparatus in recent years.

Endothermic capability of the thermoelectric cooling element 9 is generally less than 50 percent.

For this reason, the thermoelectric cooling element 9 requires electric power of twice to six times of the heating value of the reflective display device 4c so that its power consumption is extremely high.

BRIEF SUMMARY OF THE INVENTION

The present invention has been made in view of the conventional problems, and an object thereof is to provide a cooling apparatus capable of more efficiently cooling a display device of a projection display apparatus, a CPU of a personal computer, a semiconductor laser of a semiconductor laser apparatus and so on for instance.

A first aspect of the present invention is a cooling apparatus comprising:

a heat receiving casing thermally joined to a heating object directly or indirectly;

a circulating route communicated with inside of the heat receiving casing;

a fluid medium filled inside the heat receiving casing and in the circulating route;

a pump of circulating the filled fluid medium, provided inside the heat receiving casing; and cooling means of cooling the circulated fluid medium.

A second aspect of the present invention is the cooling apparatus according to the first aspect of the present invention, wherein an inflow port through which the circulated fluid medium flows into the heat receiving casing from the circulating route is provided on a side of the heat receiving casing, where the heat receiving casing is thermally joined to the heating object directly or indirectly.

A third aspect of the present invention is the cooling apparatus according to the second aspect of the present invention, wherein the pump is a centrifugal pump having a rotated blade, and the inflow port is provided in proximity to a rotational center of the rotated blade.

A fourth aspect of the present invention is the cooling apparatus according to the first aspect of the present invention, wherein the heat receiving casing has an inner wall with a concave and convex portion on a side where it is thermally joined to the heating object directly or indirectly.

A fifth aspect of the present invention is the cooling apparatus according to any one of the first to the fourth aspects of the present invention, wherein a driving electrical substrate of driving the heating object is placed on a side of the heating object, where the heat receiving casing is thermally joined directly or indirectly.

A sixth aspect of the present invention is the cooling apparatus according to the fifth aspect of the present invention, wherein a pressure holder of pressing the driving electrical substrate to the heating object is placed on a side of the driving electrical substrate, where the heat receiving casing is thermally joined directly or indirectly.

A seventh aspect of the present invention is the cooling apparatus according to the sixth aspect of the present invention, wherein the driving electrical substrate has a driving electrical substrate window, the pressure holder has a pressure holder window at a position overlapping the driving electrical substrate window, and the heat receiving casing has a heat receiving portion penetrating the driving electrical substrate window and the pressure holder window and contacting the heating object.

An eighth aspect of the present invention is the cooling apparatus according to any one of the first to the fourth aspects of the present invention, further comprising a heat receiving plate joined to the heating object.

A ninth aspect of the present invention is the cooling apparatus according to the eighth aspect of the present invention, further comprising:

an electronic cooling element joined to the heat receiving casing;

a heat receiving frame of forming sealed space between the heat receiving plate and the electronic cooling element; and a fluid material filled in the sealed space.

A tenth aspect of the present invention is the cooling apparatus according to any one of the first to the fourth aspects of the present invention, further comprising:

detection means of detecting temperature of the heating object; and control means of controlling at least one of the pump and the cooling means based on a result of the detection.

An eleventh aspect of the present invention is a projection display apparatus comprising:

the cooling apparatus according to the first aspect of the present invention; and a reflective display device as the heating object.

A twelfth aspect of the present invention is an electronic device comprising:

the cooling apparatus according to the first aspect of the present invention; and at least one of a semiconductor and a CPU as the heating object.

A thirteenth aspect of the present invention is a cooling apparatus comprising:

a heat receiving casing thermally joined to at least one of a reflective display device, a semiconductor and a CPU directly or indirectly;

a circulating route communicating with inside of the heat receiving casing;

a fluid medium inside the heat receiving casing and in the circulating route;

a pump of circulating the fluid medium; and cooling means of cooling the circulated fluid medium.

A fourteenth aspect of the present invention is a cooling method comprising:

a circulating step of circulating a fluid medium filled inside a heat receiving casing thermally joined to a heating object directly or indirectly and in a circulating route communicating with inside of the heat receiving casing, by using a pump provided inside the heat receiving casing; and a cooling step of cooling the circulating fluid medium.

The present invention has an advantage of being able to more efficiently cool electronic devices such as the display device of the projection display apparatus, the CPU of the personal computer and the semiconductor laser apparatus.

DESCRIPTION OF SYMBOLS 4a, 4b and 4c Reflective display devices
100 Cooling apparatus
102 Heat receiving plate
103 Heat receiving frame
105 Electronic cooling element
106 Fluid material
107 Solution sending pump
108, 1108, 2108, 3108 Heat receiving casings
2108a Heat receiving portion
110 Fluid medium
111 Opening
112 Inlet-side circulating route
112a Passage
114 Radiator
201 Temperature detection means
202 Temperature control means
401 Holding member
403 Driving electrical substrate
404 Pressure holder
502, 602 CPUs

BEST MODE FOR CARRYING OUT THE INVENTION

Hereunder, embodiments of the present invention will be described by referring to the drawings.

FIRST EMBODIMENT

Hereunder, a configuration of a cooling apparatus according to this embodiment will be described by mainly referring to FIGS. 1 and 2.

Figure 1:
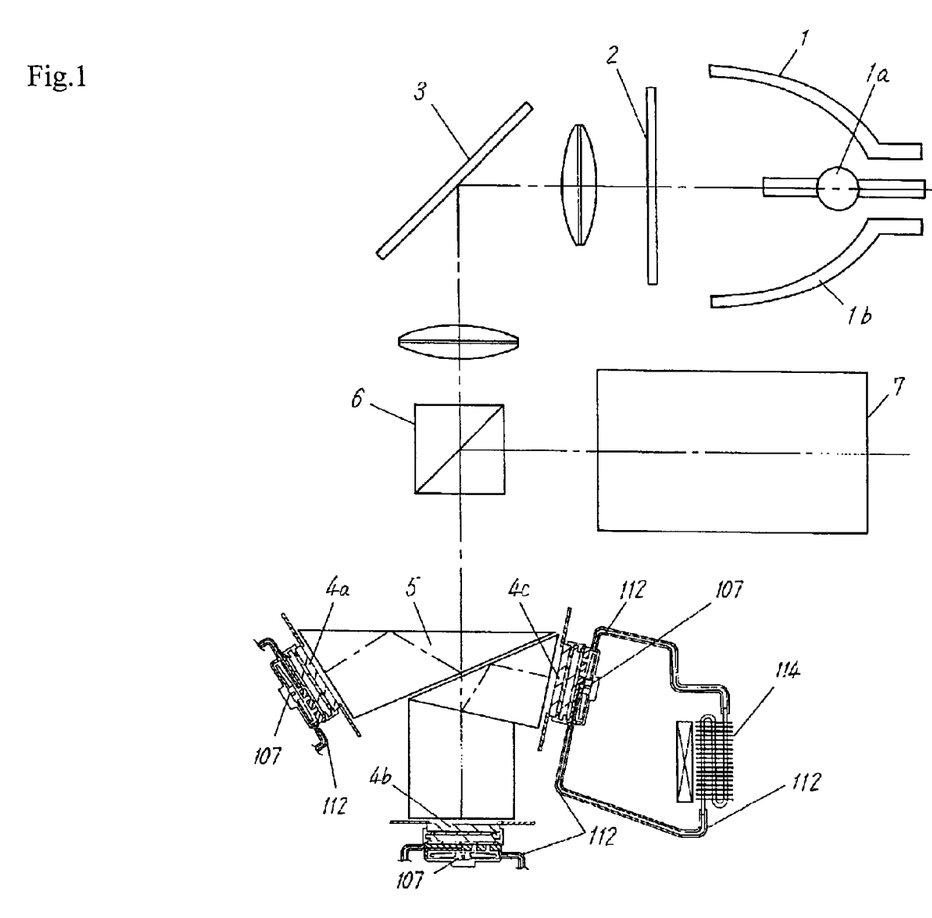
FIG. 1 is a schematic block diagram of a projection display apparatus using a cooling apparatus according to a first embodiment of the present invention.
Figure 2:
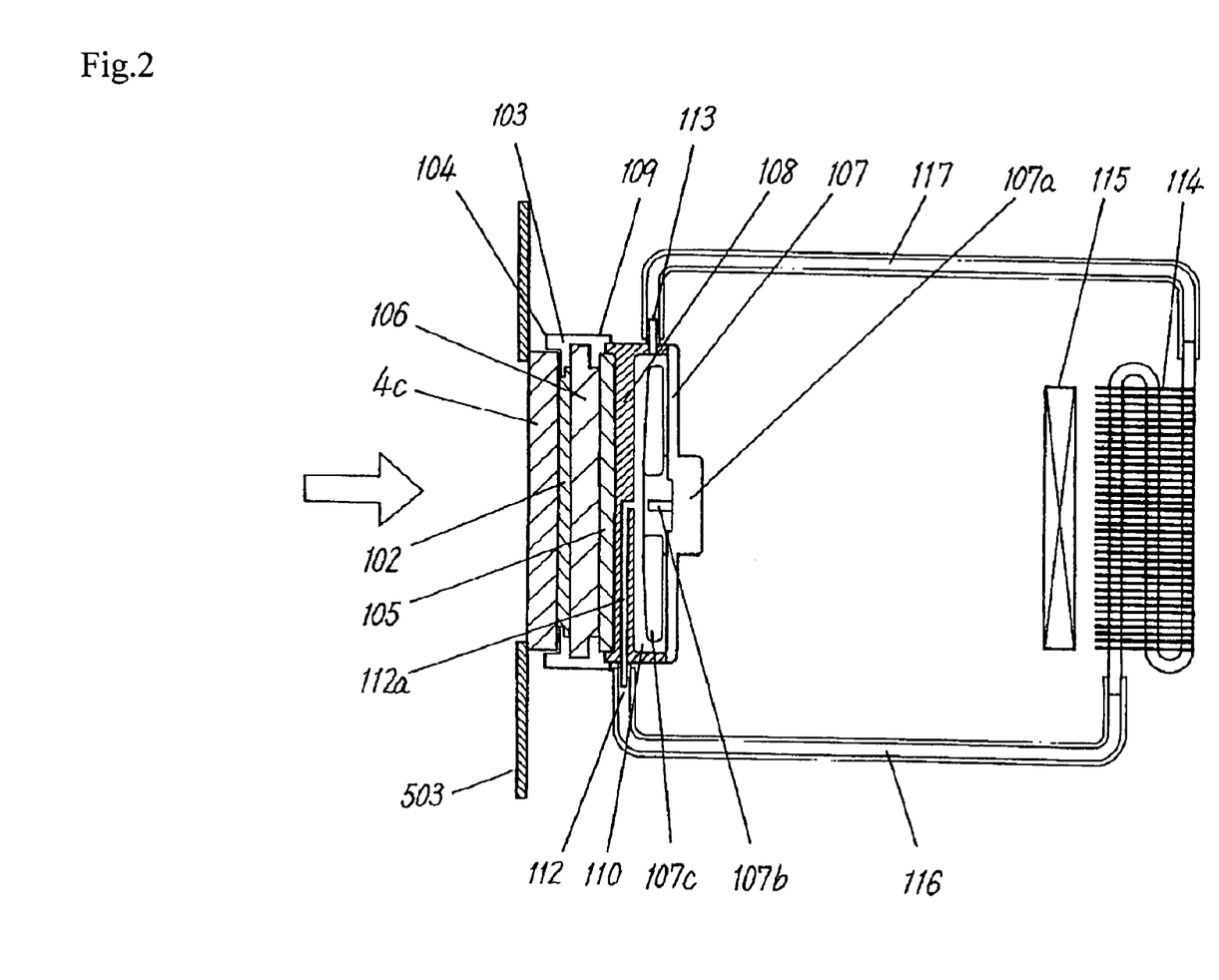
FIG. 2 is a schematic sectional view of the cooling apparatus according to the first embodiment of the present invention.

FIG. 1 is a schematic block diagram of a projection display apparatus using the cooling apparatus according to the first embodiment of the present invention, and FIG. 2 is a schematic sectional view of the cooling apparatus according to the first embodiment of the present invention.

In FIGS. 1 and 2, portions of the same configuration as a conventional apparatus described by using FIGS. 10 and 11 are given the same symbols. These portions have the same functions, and so a detailed description thereof will be omitted.

FIG. 2 shows the cooling apparatus for the reflective display device 4c which is a heating element, where the cooling apparatuses corresponding to the reflective display device 4a and 4b also have the same functions.

4a, 4b and 4c denote the reflective display devices corresponding to red (R) green (G) and blue (B) as light color-separated by the color separation and composition prism unit 5 as with conventional examples.

To describe the reflective display device 4c, a heat receiving plate 102 formed by a metal material having a high thermal conductivity such as a copper alloy or a pure aluminum is tightly joined to a backside opposite to a light-illuminated surface of the reflective display device 4*c*, where their surfaces are thermally joined.

On the light-illuminated surface side of the reflective display device 4*c*, a driving electrical substrate 503 with a window for not hindering light reception has its surface joined thereon in order to supply driving power and a driving signal to the reflective display device 4*c*.

103 denotes a heat receiving frame like a square-shaped frame formed by synthetic resin forming, where it is made of a material of a lower thermal conductivity than that of the heat receiving plate 102.

The heat receiving plate 102 and heat receiving frame 103 are integrally mounted by tightly (watertightly) joining an outer edge of the heat receiving plate 102.

This tight joining can be performed by using a rubber O ring (not shown) for instance.

As the heat receiving plate 102 and heat receiving frame 103 are mounted, a container form having an inner volume is formed in a backside direction of the reflective display device 4*c*.

A frame-like positioning portion 104 is formed on the outer edge of the reflective display device 4*c*, and an outer portion of the reflective display device 4*c* is basically positioned by the positioning portion 104.

105 denotes an electronic cooling element generally called a Peltier element, and its outer edge is tightly (watertightly) joined and fixed to the heat receiving frame 103 on the opposite side to the heat receiving plate 102.

This tight joining and fixing can also be performed by using the rubber O ring (not shown) for instance.

106 denotes a fluid material filled in space sealed by the heat receiving plate 102, heat receiving frame 103 and electronic cooling element 105, and it is comprised of an alcohol solution such as propylene glycol for instance.

Therefore, the fluid material 106 and heat receiving plate 102 are in direct plane contact, and the fluid material 106 and electronic cooling element 105 are also in direct plane contact and thermally joined.

107 denotes a solution sending pump (solution sending means) comprised of a centrifugal pump in a flat form, and 108 denotes a heat receiving casing doubling as a casing of the solution sending pump 107.

The heat receiving casing 108 is formed with a metal material having a high thermal conductivity such as an aluminum alloy for instance, and one flat surface thereof is firmly attached to the electronic cooling element 105 so as to be thermally joined thereto.

The heat receiving casing 108 and heat receiving frame 103 are positioned by a positioning portion 109 formed on the outer edge of the heat receiving frame 103, and are integrally fixed.

110 denotes a fluid medium circulated by the solution sending pump 107 to transfer heat quantity, and it is comprised of the alcohol solution such as propylene glycol for instance.

A motor 107*a* is provided to the other flat portion of the solution sending pump 107, and a blade 107*c* is integrally fixed to a motor axis 107*b*.

112 denotes a circulating route on an inlet side of the fluid medium 110 to the solution sending pump 107, and 113 denotes a circulating route on an outlet side on which the fluid medium 110 is sent from the solution sending pump 107.

The inlet-side circulating route 112 of the solution sending pump 107 is placed on one flat surface side of the heat receiving casing 108 doubling as the casing of the solution sending pump 107, that is, on the electronic cooling element 105 side.

And the circulating route 112 has a pipe passage 112*a* passing in the heat receiving casing 108 formed thereon, where an open end of the passage 112*a* is oriented toward a rotational center of the blade 107*c* rotated by the motor 107*a*.

The outlet-side circulating route 113 to which the fluid medium 110 is sent from the solution sending pump 107 is placed on the other flat surface side of the heat receiving casing 108 having the motor 107*a* placed thereon unlike the inlet-side circulating route 112 and at a position opposed to a rotational outer portion of the blade 107*c*.

114 denotes a radiator, and a radiating fan 115 is placed in proximity to the radiator 114.

The inlet-side circulating route 112 of the solution sending pump 107 and radiator 114 and the outlet-side circulating route 113 and radiator 114 are connected by flexible hoses 116 and 117 respectively.

The fluid medium 110 is filled inside the solution sending pump 107, hoses 116, 117 and radiator 114, and is sucked from the inlet-side circulating route 112 of the heat receiving casing 108 to be led in a circumferential direction and circulated by way of the outlet-side circulating route 113 by rotation of the blade 107*c* of the solution sending pump 107 due to driving of the motor 107*a*.

Next, operation of the cooling apparatus according to this embodiment will be described as cooling operation of the projection display apparatus using the cooling apparatus according to this embodiment.

An embodiment of the cooling method according to the present invention will also be described while describing the operation of the cooling apparatus according to this embodiment (as with other embodiments).

The reflective display device 4*c* which is a heating object receives the light from an arrow direction (refer to FIG. 2), and generates heat due to existence of a portion not effectively reflected.

The heat receiving plate 102 is firmly attached to the side opposite to the light-illuminated surface, that is, the backside of the reflective display device 4*c*. And the heat receiving plate 102 receives generated heat from the backside of the reflective display device 4*c*.

The heat receiving plate 102 is in contact with the fluid material 106. Therefore, the heat quantity from the heat receiving plate 102 is conveyed to the fluid material 106.

The electronic cooling element 105 of which power is turned on renders the side in contact with the fluid material 106 as an endothermic side and thereby directly absorbs the heat quantity of the fluid material 106 so as to cool the heat receiving plate 102.

And the heat receiving plate 102 cools the reflective display device 4*c*.

The electronic cooling element 105 renders the surface on the opposite side (the right side in the upper part of FIG. 2) to the endothermic side as a radiating surface. The radiating surface radiates the heat quantity adding up that from the reflective display device 4*c* and that generated by driving power of the electronic cooling element 105 itself.

As the heat receiving casing 108 doubling as the casing of the solution sending pump 107 is firmly attached to the radiating surface side of the electronic cooling element 105, radiation of the electronic cooling element 105 is conveyed to the heat receiving casing 108.

And the blade 107*c* is rotated due to driving of the motor 107*a* of the solution sending pump 107, the fluid medium 110 coming in from the inlet-side circulating route 112 has pressure exerted thereon in a centrifugal direction so as to be sent from the outlet-side circulating route 113.

As thermal conduction between the heat receiving plate 102 and the electronic cooling element 105 is performed via the fluid material 106 such as the alcohol solution like propylene glycol, there is no longer a defect of low thermal conductivity in a boundary portion so that cooling efficiency can be improved.

In general, a junction between solids has high thermal resistance and very low thermal conductivity. As for such a cooling apparatus, however, sufficient cooling effects cannot be obtained if the thermal conduction is bad.

According to this embodiment, however, the fluid material 106 directly contacts the heat receiving plate 102 and electronic cooling element 105 to perform the thermal conduction. Therefore, there is no such increase in the thermal resistance as that seen in the case of the junction between solids.

Thus, the thermal conduction from the heat receiving plate 102 to the electronic cooling element 105 becomes very good and the cooling efficiency is improved.

The heat receiving casing 108 has the inlet-side circulating route 112 of the fluid medium 110 provided on one flat surface side thereof thermally joined to the electronic cooling element 105.

For this reason, the fluid medium 110 cooled by the radiator 114 is flowed into the solution sending pump 107 via the passage 112a from the electronic cooling element 105 side.

Thus, the cooling efficiency is improved.

The circulated fluid medium 110 is radiated outside by the radiator 114 cooled by the radiating fan 115, and is returned inside the heat receiving casing 108 after its temperature is reduced.

This is repeated so that the heat quantity of the reflective display device 4c as a heating object is radiated with dramatically higher efficiency.

As a matter of course, the cooling apparatus is configured likewise on the sides of the reflective display devices 4a and 4b so as to implement high-efficiency cooling of the display devices of the entire projection display apparatus (as with other embodiments).

The heat receiving casing 108 is corresponding to the heat receiving casing of the present invention, the means including the hoses 116 and 117 are corresponding to the circulating routes of the present invention, the fluid medium 110 is corresponding to the fluid medium of the present invention, the solution sending pump 107 is corresponding to the pump of the present invention, and the means including the radiator 114 and radiating fan 115 are corresponding to the cooling means of the present invention.

The heat receiving plate 102 is corresponding to the heat receiving plate of the present invention.

The electronic cooling element 105 is corresponding to the electronic cooling element of the present invention, the heat receiving frame 103 is corresponding to the heat receiving frame of the present invention, and the fluid material 106 is corresponding to the fluid material of the present invention.

The reflective display devices 4a, 4b and 4c are corresponding to the reflective display devices of the present invention.

SECOND EMBODIMENT

First, a description will be given by mainly referring to FIG. 3 as to the configuration and operation of the cooling apparatus according to this embodiment.

Figure 3:
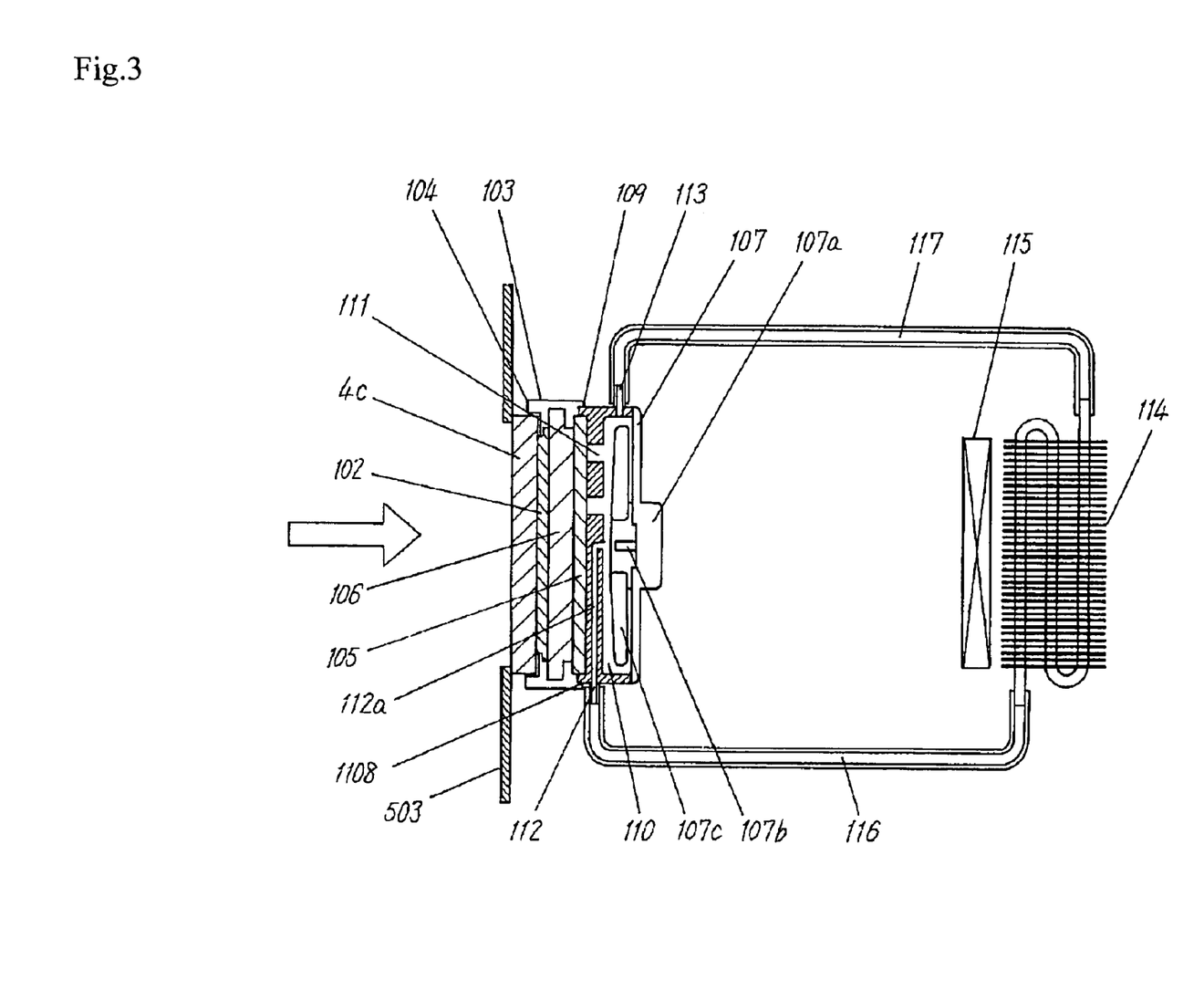
FIG. 3 is a schematic sectional view of the cooling apparatus according to a second embodiment of the present invention.

FIG. 3 is a schematic sectional view of the cooling apparatus according to the second embodiment of the present invention.

The cooling apparatus according to this embodiment is similar to that according to the first embodiment. Therefore, differences between them will be mainly described.

The cooling apparatus according to this embodiment has a plurality of openings 111 provided in a joining casing surface (one flat surface) of a heat receiving casing 1108 thermally joined to the electronic cooling element 105.

And the electronic cooling element 105 is directly contacted by the fluid medium 110 circulated inside the heat receiving casing 1108 through the openings 111.

Each of the plurality of openings 111 is circular for instance, and they are arranged like a matrix except a portion in which the passage 112a is located.

And the plurality of openings 111 are formed to have gross area of at least one third to the area of the contact surface of the electronic cooling element 105 and the heat receiving casing 1108 in order to facilitate the thermal conduction from the electronic cooling element 105 to the fluid medium 110.

As the plurality of openings 111 are provided to the heat receiving casing 1108, the fluid medium 110 directly contacts the electronic cooling element 105.

And an inner surface of the heat receiving casing 1108 becomes a plurality of concavities and convexities due to the openings 111, and so disorder occurs to a circulating flow of the fluid medium 110 inside the heat receiving casing 1108, that is, inside the solution sending pump 107.

A thermal boundary layer due to the thermal conduction gets deranged due to such disorder of the circulating flow. And a heat transfer coefficient, that is, the way heat is conveyed, so to speak, from the electronic cooling element 105 to the fluid medium 110, is dramatically improved so that the cooling efficiency becomes much higher.

The heat receiving casing 1108 is corresponding to the heat receiving casing of the present invention.

THIRD EMBODIMENT

First, a description will be given by mainly referring to FIG. 4 as to the configuration and operation of the cooling apparatus according to this embodiment.

Figure 4:
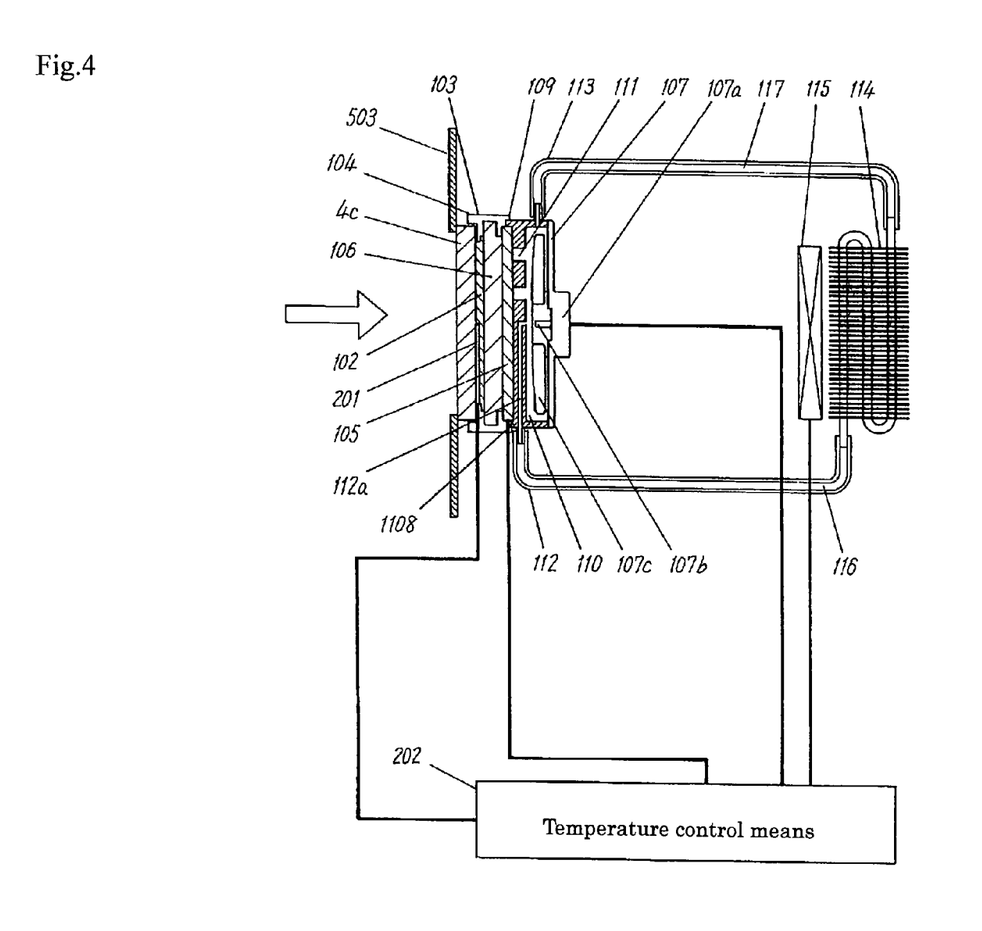
FIG. 4 is a schematic sectional view of the cooling apparatus according to a third embodiment of the present invention.

FIG. 4 is a schematic sectional view of the cooling apparatus according to the third embodiment of the present invention.

The cooling apparatus according to this embodiment is similar to that according to the aforementioned second embodiment. Therefore, the differences between them will be mainly described.

The cooling apparatus according to this embodiment is capable of temperature control.

To be more precise, temperature detection means 201 of detecting temperature of the reflective display device 4c as the heating object and converting it to an electrical signal is integrally built into the heat receiving plate 102.

And temperature control means 202 of controlling driving of the solution sending pump 107 and driving of the radiating fan 115 to the radiator 114 into an optimal state is provided in order to (a) adjust the driving power corresponding to an endothermic amount of the electronic cooling element 105 so as to adjust the reflective display device 4c to a desired temperature according to temperature information from the temperature detection means 201 and in order to (b) adjust a sent amount of the fluid medium 110 circulated by the solution sending pump 107.

To be more precise, the temperature information on the reflective display device 4c detected by the temperature detection means 201 is inputted to the temperature control means 202, the driving power of the solution sending pump 107 and that of the radiating fan 115 are controlled according to control target values, and input power of the electronic cooling element 105 is adjusted.

Thus, very meticulous temperature control becomes possible, and increase in the power consumption due to excessive cooling can be curbed.

The temperature detection means 201 is corresponding to the detection means of the present invention, and the temperature control means 202 is corresponding to the control means of the present invention.

FOURTH EMBODIMENT

First, a description will be given by mainly referring to FIG. 5 as to the configuration and operation of the cooling apparatus according to this embodiment.

Figure 5:
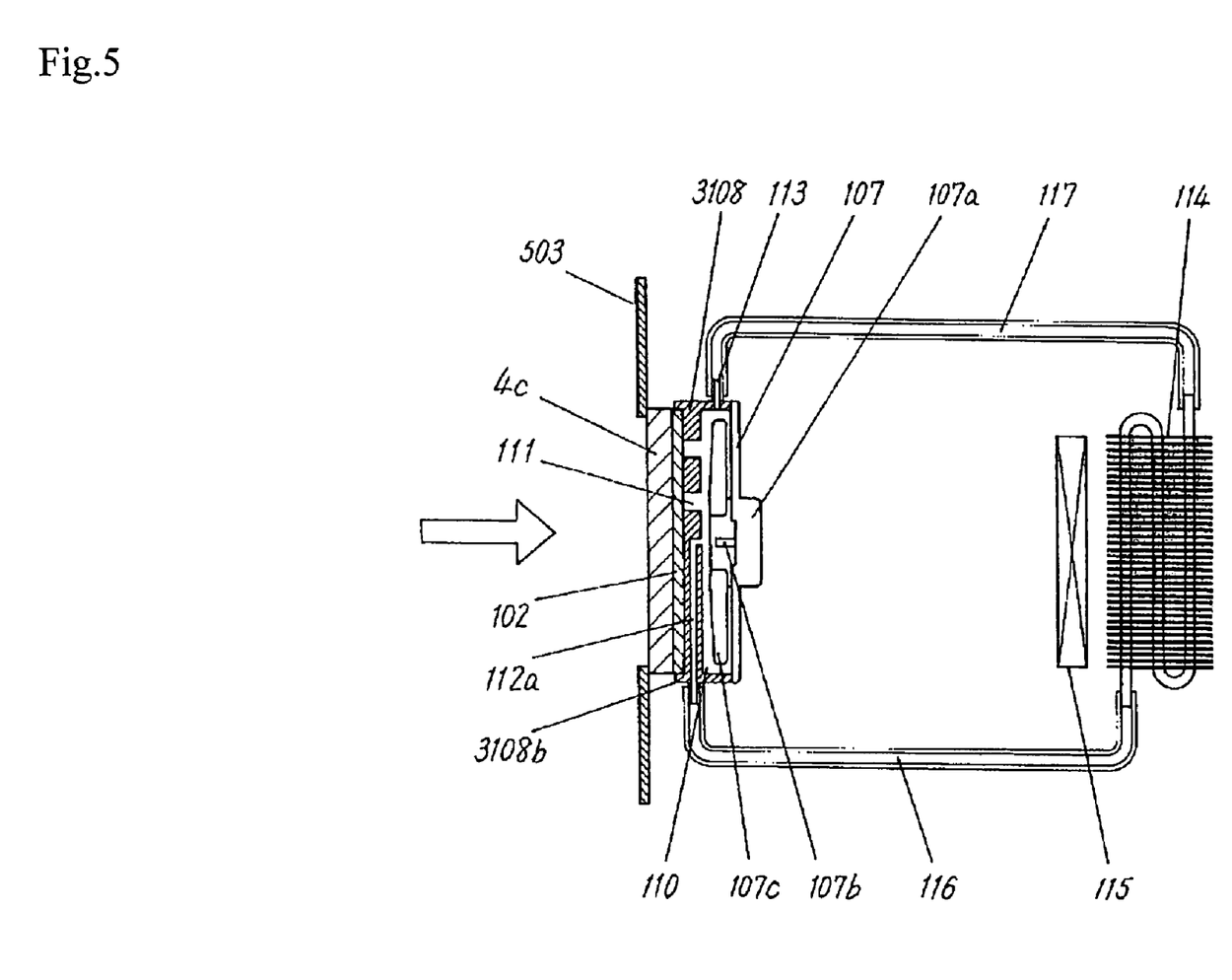
FIG. 5 is a schematic sectional view of the cooling apparatus according to a fourth embodiment of the present invention.

FIG. 5 is a schematic sectional view of the cooling apparatus according to the fourth embodiment of the present invention.

The cooling apparatus according to this embodiment is similar to that according to the aforementioned second embodiment. Therefore, the differences between them will be mainly described.

According to this embodiment, a heat receiving casing 3108 having a plurality of openings 111 provided thereon is firmly attached directly and thermally joined to the heat receiving plate 102 joined to the reflective display device 4c.

As a matter of course, the openings 111 of the heat receiving casing 3108 are watertightly configured by the heat receiving plate 102.

The heat receiving plate 102 and heat receiving casing 3108 are mutually positioned by a positioning portion 3108b formed on the heat receiving casing 3108.

With such a configuration, disorder occurs to the circulating flow of the fluid medium 110 due to the plurality of openings 111 as with the second embodiment.

As the fluid medium 110 directly contacts the heat receiving plate 102, the cooling efficiency of the reflective display device 4c is significantly improved.

The heat receiving casing 3108 is corresponding to the heat receiving casing of the present invention.

FIFTH EMBODIMENT

First, a description will be given by mainly referring to FIG. 6 as to the configuration and operation of the cooling apparatus according to this embodiment.

Figure 6:
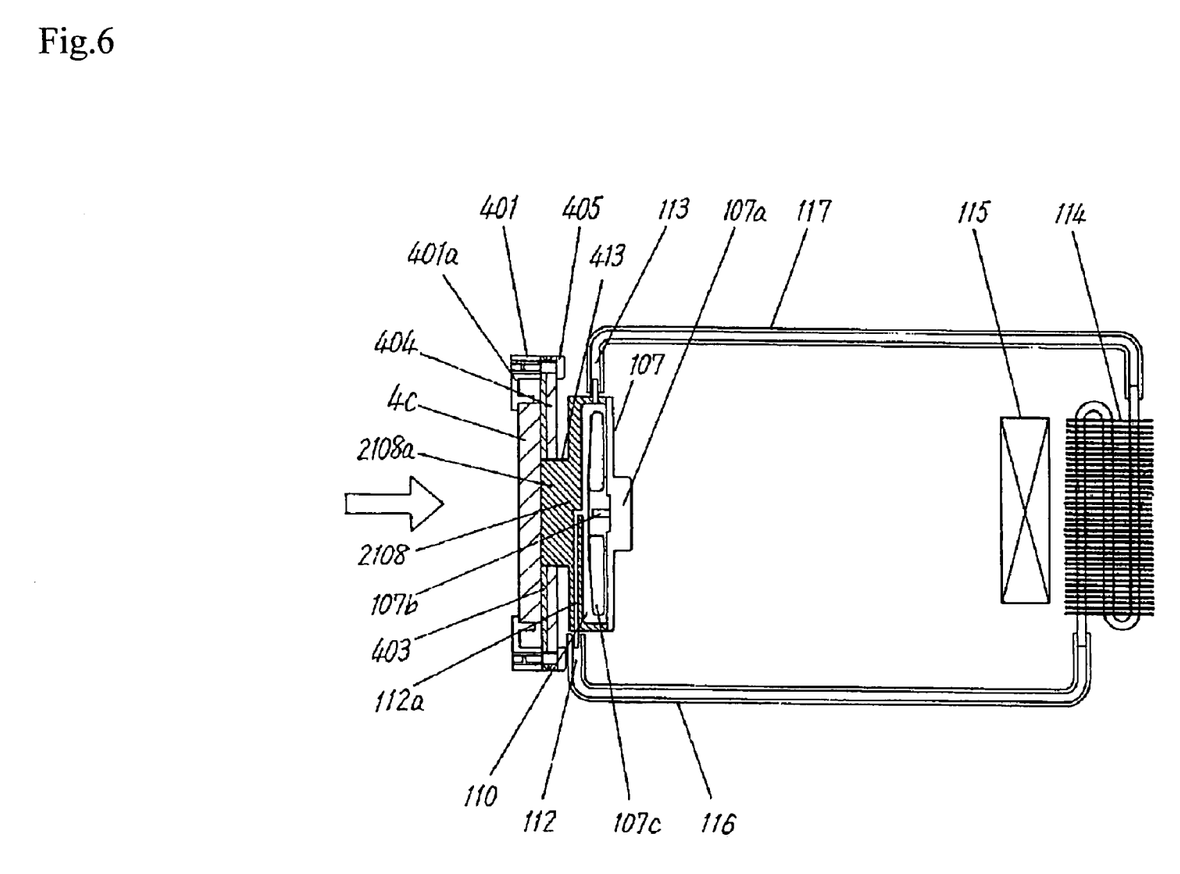
FIG. 6 is a schematic sectional view of the cooling apparatus according to a fifth embodiment of the present invention.

FIG. 6 is a schematic sectional view of the cooling apparatus according to the fifth embodiment of the present invention.

The cooling apparatus according to this embodiment is similar to that according to the aforementioned fourth embodiment. Therefore, the differences between them will be mainly described.

401 denotes a frame-like holding member having a locking part 401a and holding the reflective display device 4c with the locking part 401a.

On the backside of the holding member 401, a driving electrical substrate 403 is joined on its surface in order to supply the driving power and driving signal to the reflective display device 4c.

404 denotes a pressure holder comprised of the aluminum alloy of high rigidity having its surface joined on the opposite side to a joining surface of the reflective display device 4c of the driving electrical substrate 403.

The reflective display device 4c, driving electrical substrate 403 and pressure holder 404 are fixed and integrated by a setscrew 405 screwed at an end of the holding member 401.

And a terminal of the reflective display device 4c is electrically connected to the terminal of the driving electrical substrate 403.

A heat receiving portion 2108a like a jutting shape is formed on one flat surface side opposed to the reflective display device 4c of the heat receiving casing 2108 doubling as the casing of the solution sending pump 107 formed with a metal material having a high thermal conductivity such as the aluminum alloy for instance.

The heat receiving portion 2108a is positioned by being fitted into rectangular holes (not shown) provided in central parts of the pressure holder 404 and the driving electrical substrate 403 respectively.

The flat surface at the end of the heat receiving portion 2108a of the heat receiving casing 2108 is firmly attached and thermally joined to the backside of the reflective display device 4c.

Next, a description will be given as to the operation of the cooling apparatus according to this embodiment.

The reflective display device 4c receives the light from the arrow direction, and generates heat due to optical energy components not effectively used.

The heat generated by the reflective display device 4c is thermally conducted directly to the heat receiving portion 2108a of the heat receiving casing 2108 firmly attached to its backside.

The fluid medium 110 is filled inside the heat receiving casing 2108, and the thermally conducted heat of the heat receiving casing 2108 is conveyed to the fluid medium 110 inside it.

As with the aforementioned embodiment, the fluid medium 110 is circulated to and from the radiator 114 by the solution sending pump 107 so as to be cooled as desired.

According to the fifth embodiment, windows are provided on the central parts of the pressure holder 404 and the driving electrical substrate 403. And the heat receiving portion 2108a of the heat receiving casing 2108 is fitted from these windows so that the surface of the backside of the reflective display device 4c is in direct contact with the surface of the heat receiving casing 2108.

For this reason, it is easy to position the heat receiving casing 2108 against the reflective display device 4c in reference to the aforementioned windows.

The heat receiving casing 2108 is corresponding to the heat receiving casing of the present invention.

The first to fifth embodiments were described in detail above.

(1) The heat receiving casing 108 having the openings 111 provided therein does not necessarily have to double as the casing of the solution sending pump 107. The casing of the solution sending pump 107 may be provided in the middle of the hose 116 or 117.

(2) The fluid medium may be either water or an alcohol solution.

(3) The circulating route of the medium is a so-called hose. It is even better if it is a flexible hose such as butyl rubber.

(4) The pump (solution sending means) is a centrifugal pump of sucking it from the center and discharging it in the circumferential direction. However, it may also be a positive-displacement pump of varying capacity by reciprocation of a diaphragm or a piston and repeatedly ejecting a fixed amount of liquid.

Figure 7:
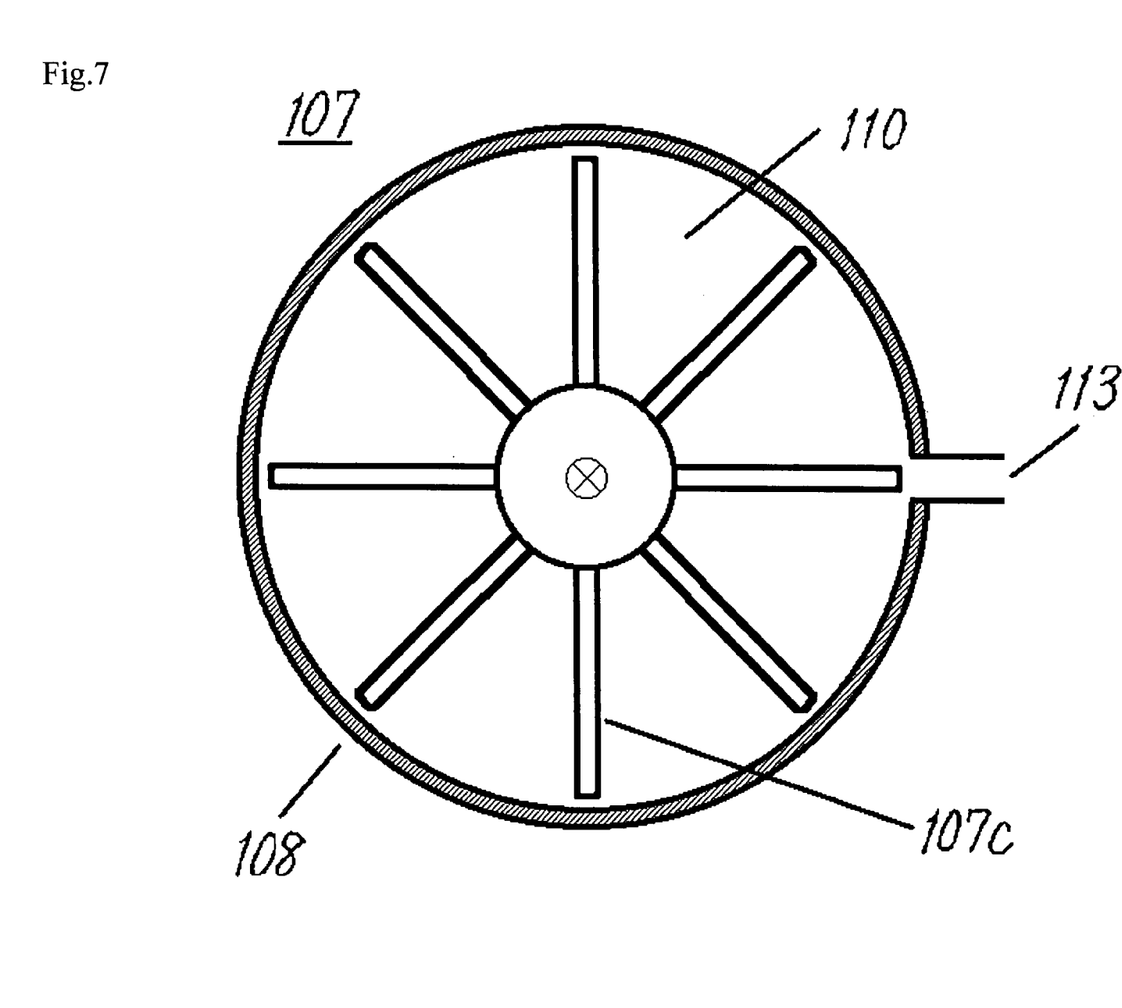
FIG. 7 is a schematic plan view of a solution sending pump 107 according to the first embodiment of the present invention.

As shown in FIG. 7 which is a schematic plan view of the solution sending pump 107 according to the first embodiment of the present invention, in the case of using the centrifugal pump, the fluid medium 110 coming in vertically downward (orientation of fletching) as to space has pressure exerted thereto in the centrifugal direction due to the rotation of the blade 107c so as to be sent from the outlet-side circulating route 113.

(5) In the case where the reflective display device, that is, the heating object itself comprises a plate of a high thermal conductivity, the heat receiving plate 102 as a separate body is not always necessary.

(6) A plurality of openings are provided to a wall portion on the thermally conducted side of the heat receiving casing. However, it is not limited thereto, but one large opening may be provided.

As a matter of course, the form of the opening is not limited to a circular form but may be a square or another form.

In the case of providing a plurality of openings, arrangement thereof may be arbitrary.

In short, there may be concave and convex portions for the sake of generating a turbulent flow provided on an inner wall on the thermally conducted side of the heat receiving casing.

(7) The reflective display device 4c as the heating object is in direct contact with the heat receiving plate 102. However, it is not limited thereto, but there may be an auxiliary thermal conduction member intervening, having heat transfer grease applied to its junction in order to further improve the thermal conduction.

As a matter of course, there may be the auxiliary thermal conduction member such as the heat transfer grease intervening between firmly attached surfaces of the reflective display device 4c and the heat receiving portion 2108a of the heat receiving casing 2108.

(8) According to the above-mentioned third embodiment, the temperature control means 202 controls a solution sending driving condition of the solution sending pump 107, an air-cooling driving condition of the radiating fan 115 for the radiator 114, and a driving condition according to the endothermic amount of the electronic cooling element 105. However, it is not limited thereto, but it is sufficient for the temperature control means 202 to control at least one of the three conditions of the solution sending driving condition of the solution sending pump 107, the driving condition of the electronic cooling element 105, and the air-cooling driving condition of the radiating fan 115.

As a matter of course, it is possible to determine which of the three conditions should be controlled according to a temperature status of the reflective display device 4c.

Such control is effective as to any of the above-mentioned embodiments.

(9) The cooling apparatuses of the above-mentioned embodiments are provided to the reflective display devices in a 3-light value projection display apparatus so as to cool the heating object of the projection display apparatus with high efficiency.

As a matter of course, it is also possible, not limited to the 3-light value projection display apparatus of using three reflective display devices for R, G and B, to use such a cooling apparatus for a single-light value projection display apparatus commercially available as a mobile apparatus of creating color information on R, G and B in chronological order by using one reflective display device.

Furthermore, the cooling apparatuses of the above-mentioned embodiments are not only mountable on the projection display apparatus, but also mountable as the cooling apparatuses of electronic devices requiring thermal control such as a CPU of a personal computer and a semiconductor laser apparatus.

Figure 8:
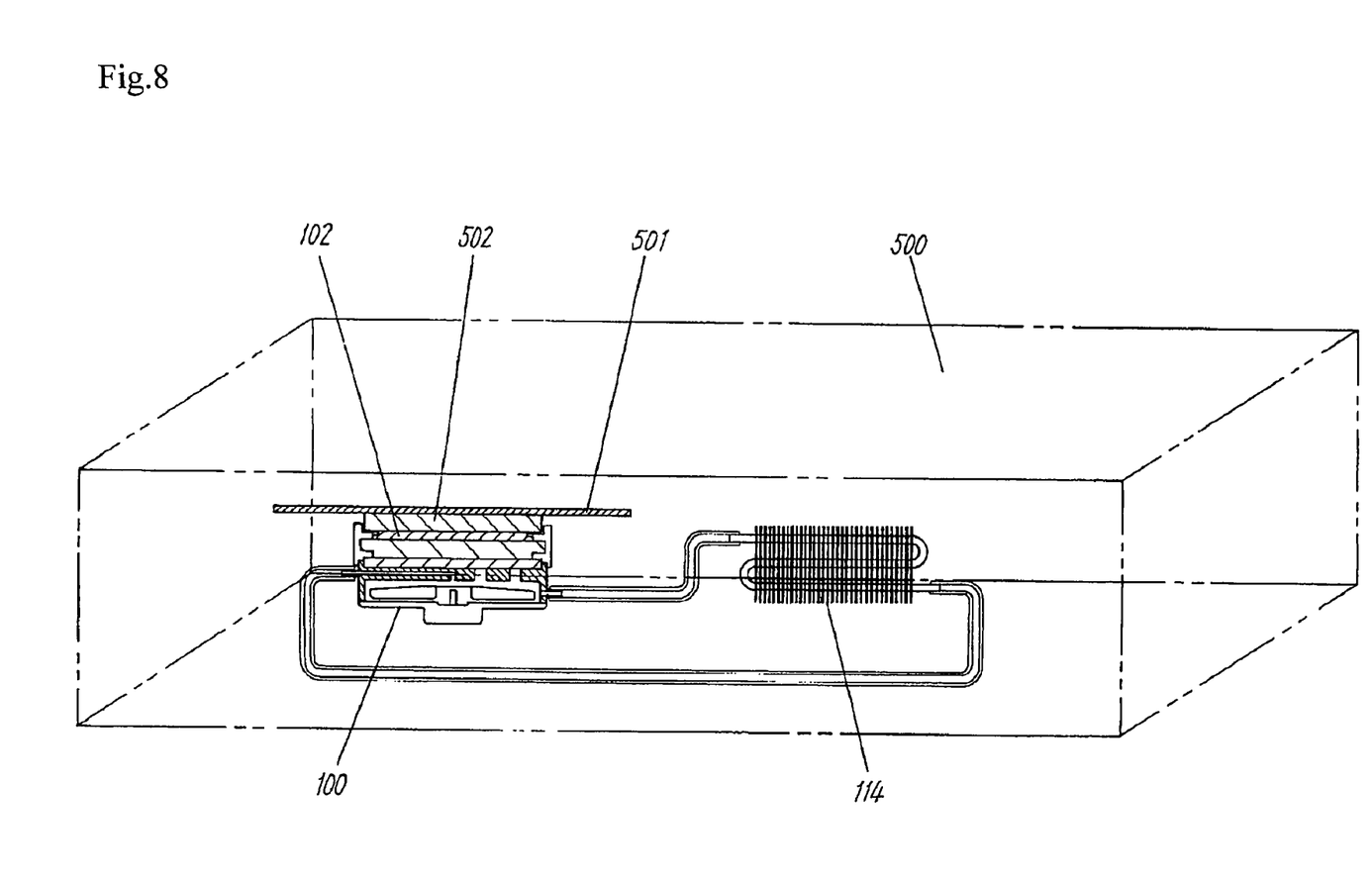
FIG. 8 is a schematic block diagram of a personal computer using a cooling apparatus 100 according to the embodiment of the present invention.

(9a) To be more precise, it is possible to cool the CPU of the electronic devices such as a personal computer, as shown in FIG. 8 which is a schematic block diagram of the personal computer using a cooling apparatus 100 according to the embodiment of the present invention.

The cooling apparatus 100 has the same configuration as that of the cooling apparatus according to the above-mentioned second embodiment of the present invention.

A CPU 502, which is the heating object mounted on a driving electrical substrate 501 in a cabinet 500, has the cooling apparatus 100 provided on its surface. This is the heat receiving plate 102 thermally joined to a radiating surface of the CPU 502.

The radiator 114 is the same as that of the above-mentioned second embodiment.

This can cool the generated heat of the CPU 502 efficiently instead of the reflective display devices.

The CPU 502 is corresponding to the CPU of the present invention.

Figure 9:
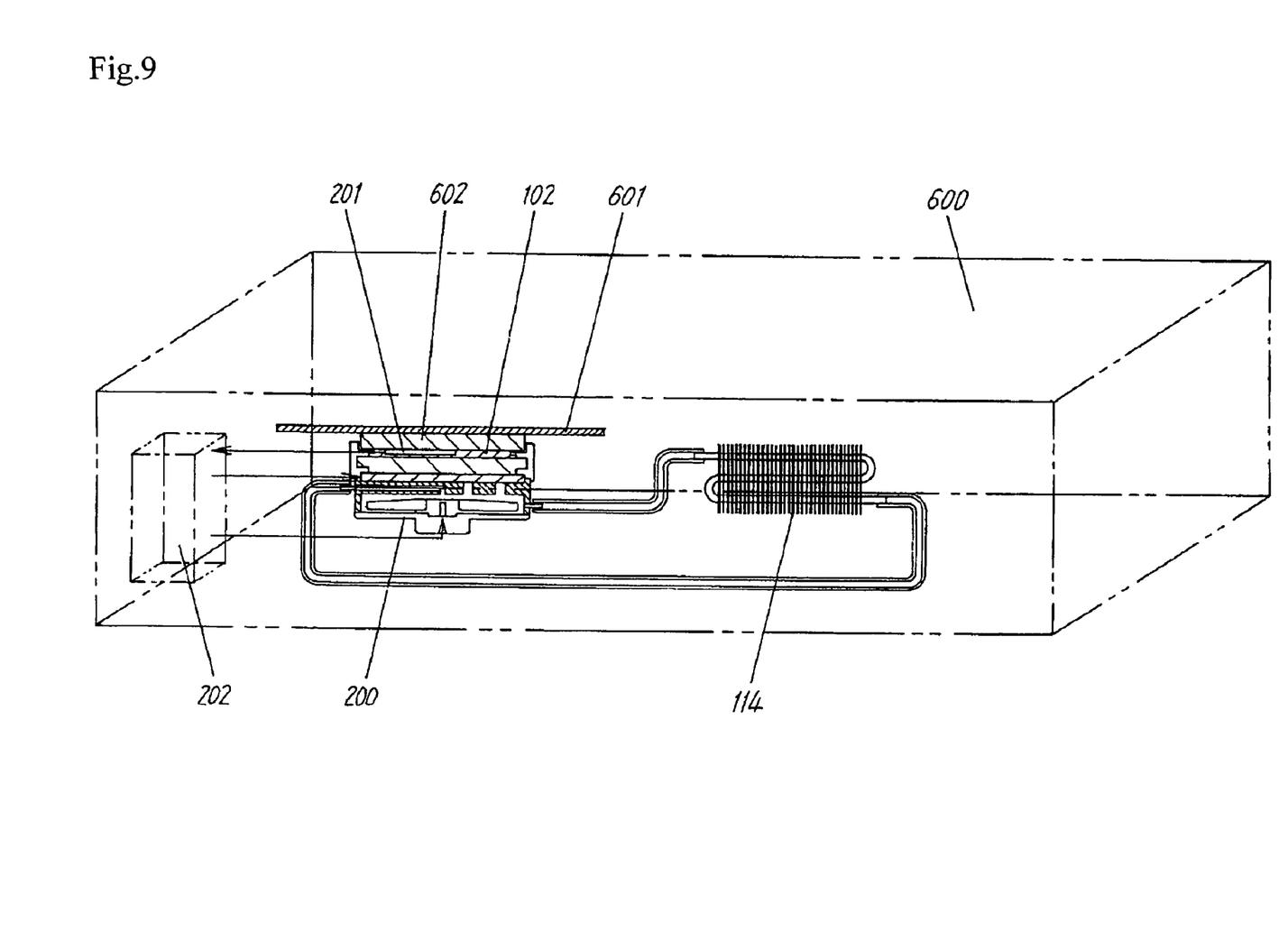
FIG. 9 is a schematic block diagram of a personal computer using a cooling apparatus 200 according to the embodiment of the present invention.

(9b) As shown in FIG. 9 which is a schematic block diagram of the personal computer using a cooling apparatus 200 according to the embodiment of the present invention, it is possible to cool the CPU of the electronic devices such as the personal computer.

The cooling apparatus 200 has the same configuration as that of the cooling apparatus according to the above-mentioned third embodiment of the present invention.

A CPU 602, which is the heating object mounted on a driving electrical substrate 601 in a cabinet 600, has the cooling apparatus 200 capable of the temperature control provided on its surface.

In short, this is the heat receiving plate 102 having the temperature detection means 201 built therein thermally joined to the radiating surface of the CPU 602.

The temperature control means 202 and radiator 114 are the same as those of the above-mentioned third embodiment.

According to this, the temperature control means 202 can control the solution sending pump 107, electronic cooling element 105 and radiating fan (not shown) and perform optimal cooling according to the control target values based on the temperature information on the CPU 602 detected by the temperature detection means 201.

It is possible to render a cabinet size of the apparatus extremely thin by placing the heating object and its heat receiving portion apart from the radiator 114.

The CPU 602 is corresponding to the CPU of the present invention.

The heating object requiring the cooling is not limited to the CPU of the personal computer, but it may also be a laser diode or another heating object having a high-output heating value such as a semiconductor laser of another electronic device.

As a matter of course, the radiator 114 does not need to be placed at the center of the cabinet, but may also be placed in a portion close to the outside of the cabinet in order to perform good cooling by using the radiation by means of external air.

The cooling apparatus of the present invention is useful since it can more efficiently cool the display device of the projection display apparatus, the CPU of the personal computer, the semiconductor laser of the semiconductor laser apparatus and so on for instance.

The invention claimed is:

1. A cooling apparatus comprising:
   a heat receiving casing thermally joined to a heating object directly or indirectly;
   a circulating route communicating with inside of the heat receiving casing;
   a fluid medium inside the heat receiving casing and in the circulating route;
   a pump of circulating the fluid medium, and provided inside the heat receiving casing; and
   cooling means of cooling the circulated fluid medium,
   wherein a driving electrical substrate of driving the heating object is placed on a side of the heating object, where the heat receiving casing is thermally joined directly or indirectly,
   a pressure holder of pressing the driving electrical substrate to the heating object is placed on a side of the driving electrical substrate, where the heat receiving casing is thermally joined directly or indirectly,
   the driving electrical substrate has a driving electrical substrate window,
   the pressure holder has a pressure holder window at a position overlapping the driving electrical substrate window, and
   the heat receiving casing has a heat receiving portion penetrating the driving electrical substrate window and the pressure holder window and contacting the heating object.

2. The cooling apparatus according to claim 1, wherein an inflow port through which the circulated fluid medium flows into the heat receiving casing from the circulating route is provided on a side of the heat receiving casing, where the heat receiving casing is thermally joined to the heating object directly or indirectly.

3. The cooling apparatus according to claim 2,
   wherein the pump is a centrifugal pump having a rotating blade, and
   the inflow port is provided in proximity to a rotational center of the rotating blade.

4. The cooling apparatus according to claim 1, wherein the heat receiving casing has an inner wall with a concave and convex portion on a side where it is thermally joined to the heating object directly or indirectly.

5. The cooling apparatus according to any one of claims 1 to 4, further comprising a heat receiving plate joined to the heating object.

6. The cooling apparatus according to claim 5, further comprising:
   an electronic cooling element joined to the heat receiving casing;
   a heat receiving frame of forming a sealed space between the heat receiving plate and the electronic cooling element; and
   a fluid material in the sealed space.

7. The cooling apparatus according to any one of claims 1 to 4, further comprising:
   detection means of detecting temperature of the heating object; and
   control means of controlling at least one of the pump and the cooling means based on a result of the detection.

8. A projection display apparatus comprising:
   the cooling apparatus according to claim 1; and
   a reflective display device as the heating object.

9. An electronic device comprising:
   the cooling apparatus according to claim 1; and
   at least one of a semiconductor and a CPU as the heating object.

10. A cooling method comprising:
    a circulating step of circulating a fluid medium filled inside a heat receiving casing thermally joined to a heating object directly or indirectly and in a circulating route communicating with inside of the heat receiving casing, by using a pump provided inside the heat receiving casing; and
    a cooling step of cooling the circulating fluid medium,
    wherein a driving electrical substrate of driving the heating object is placed on a side of the heating object, where the heat receiving casing is thermally joined directly or indirectly,
    a pressure holder of pressing the driving electrical substrate to the heating object is placed on a side of the driving electrical substrate, where the heat receiving casing is thermally joined directly or indirectly,
    the driving electrical substrate has a driving electrical substrate window,
    the pressure holder has a pressure holder window at a position overlapping the driving electrical substrate window, and
    the heat receiving casing has a heat receiving portion penetrating the driving electrical substrate window and the pressure holder window and contacting the heating object.

* * * * *